United States Patent [19]

Kawase

[11] Patent Number: 5,654,572

[45] Date of Patent: Aug. 5, 1997

[54] STATIC RANDOM ACCESS MEMORY DEVICE

[75] Inventor: Yoshihiro Kawase, Tokyo, Japan

[73] Assignee: NKK Corporation, Tokyo, Japan

[21] Appl. No.: 551,915

[22] Filed: Oct. 23, 1995

[30] Foreign Application Priority Data

Oct. 28, 1994 [JP] Japan ..................... 6-265795
Oct. 16, 1995 [JP] Japan ..................... 7-266883

[51] Int. Cl.$^6$ ............. H01L 29/76; H01L 29/94; H01L 31/062
[52] U.S. Cl. ............. 257/371; 257/377; 257/384; 257/390; 257/903
[58] Field of Search ............. 257/371, 377, 257/382, 384, 390, 903, 904

[56] References Cited

U.S. PATENT DOCUMENTS

| 5,352,916 | 10/1994 | Kiyono et al. | 257/903 |
| 5,506,802 | 4/1996 | Kiyono | 257/903 |
| 5,521,416 | 5/1996 | Matsuoka et al. | 257/903 |
| 5,543,652 | 8/1996 | Ikeda et al. | 257/903 |

OTHER PUBLICATIONS

1993 Symposium on VLSI Tech. Digest of Technical Papers (1993) p. 65, Kavanaugh et al, "A Low COS, Microprocessor Compatible".

*Primary Examiner*—Ngân V. Ngô
*Attorney, Agent, or Firm*—Nixon & Vanderhye P.C.

[57] ABSTRACT

PMOS transistors and NMOS transistors are used to form an SRAM cell. Each cell comprises its own P-well contact (14) and a Vcc contact (18) in its cell area. These contacts are placed between common polysilicon gates (9, 10) of pull-down MOS transistors and pull-up MOS transistors, said gates extending in parallel with two bit lines. The P-well contact consists of a $p^+$-type diffusion layer formed within the P-well in contact with an $n^+$-type source region of the pull-down MOS transistor, said $p^+$-type diffusion layer being positioned closer to the boundary between the P-well and the N-well than the source region.

5 Claims, 11 Drawing Sheets

STATIC RANDOM ACCESS MEMORY DEVICE

TECHNICAL FIELD

The present invention relates to a semiconductor memory device, particularly, to a semiconductor memory device comprising a six transistor-type complete static memory cell including cross-coupled CMOS inverters and pass gate NMOS transistors connected to the intermediate nodes of the cross-coupled CMOS inverters.

BACKGROUND ART

As known to the art, the static RAM (SRAM) cell includes a complete CMOS type and an E/R type. The complete CMOS type SRAM Cell consists of six transistors including two PMOS transistors, two NMOS transistors, said PMOS and NMOS transistors forming a flip-flop circuit, and two pass-gate NMOS transistors serving to connect the flip-flop circuit to bit lines. On the other hand, the E/R type SRAM cell consists of four transistors and two resistors. These two resistors are formed of highly resistant polycrystalline silicon (polysilicon) and replace the two PMOS transistors included in the complete CMOS type SRAM cell.

The complete CMOS type SRAM cell can be operated with a high stability and with a small power consumption, but has a drawback that the cell area is large. The E/R type SRAM cell has an advantage of a decreased cell area because a polysilicon film of high resistance can be superposed on the NMOS transistor, with the result that the cell area is substantially equal to the sum of the areas required for the four NMOS transistors included in the cell. However, since resistors are used in place of the two PMOS transistors, the gain of the inverter is decreased, leading to a poor stability. In addition, when the NMOS transistor is turned on, current flows between Vcc and GND through the polysilicon layer of a high resistance, leading to an increased power consumption.

Figure 9:
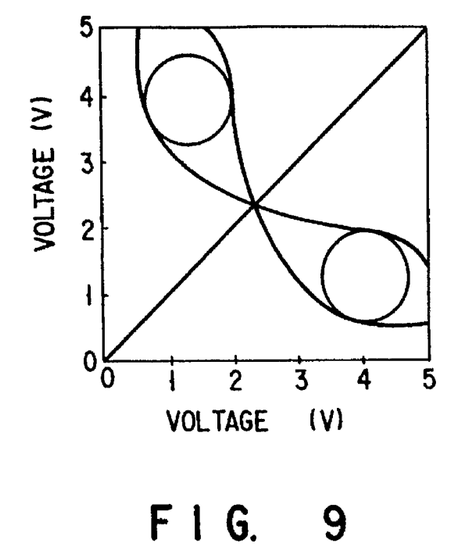
FIG. 9 shows butterfly characteristics of a complete CMOS type cell.
Figure 10:
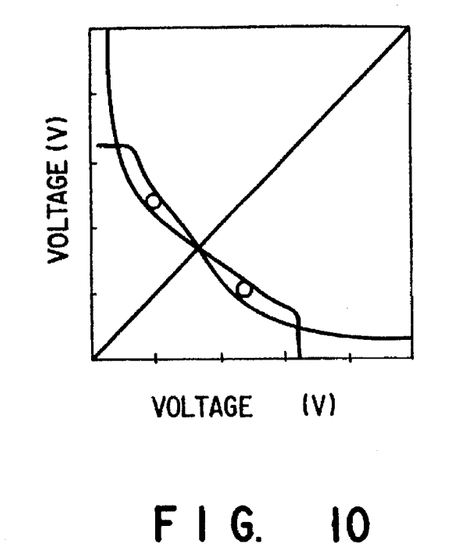
FIG. 10 shows butterfly characteristics of an E/R type cell.
Figure 11:
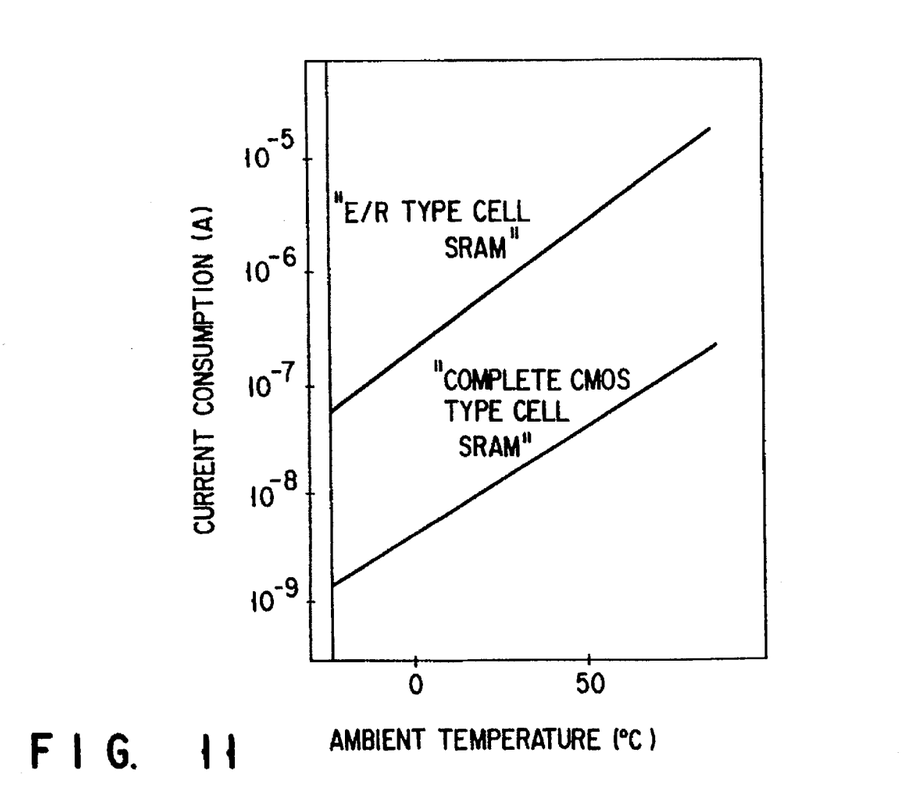
FIG. 11 shows the temperature dependence of stand current characteristics of a complete CMOS type cell SRAM and an E/R type cell SRAM, respectively.

FIG. 9 shows a "butterfly" characteristics (the state in the reading step) of a complete CMOS type cell, and FIG. 10 shows that of an E/R type cell. It is clearly seen that the complete CMOS type cell is superior in stability to the E/R type cell. Further, FIG. 11 shows the current consumption with respect to the ambient temperature, in the stand-by mode or covering the case where each of the complete CMOS type cell and the E/R type cell is at rest. It is clearly seen that the power consumption of the complete CMOS type cell is smaller.

Recently, a semiconductor device is required to be operated with a low voltage (about 3.3 V) and with a small power consumption. It is difficult to meet these requirements in operating an E/R type cell with a high stability. Where the complete CMOS type cell comprising six transistors is allowed to be operated with a high stability and with a small power consumption, however, it is necessary to increase the cell area, resulting in failure to miniaturize the semiconductor device.

Figure 13:
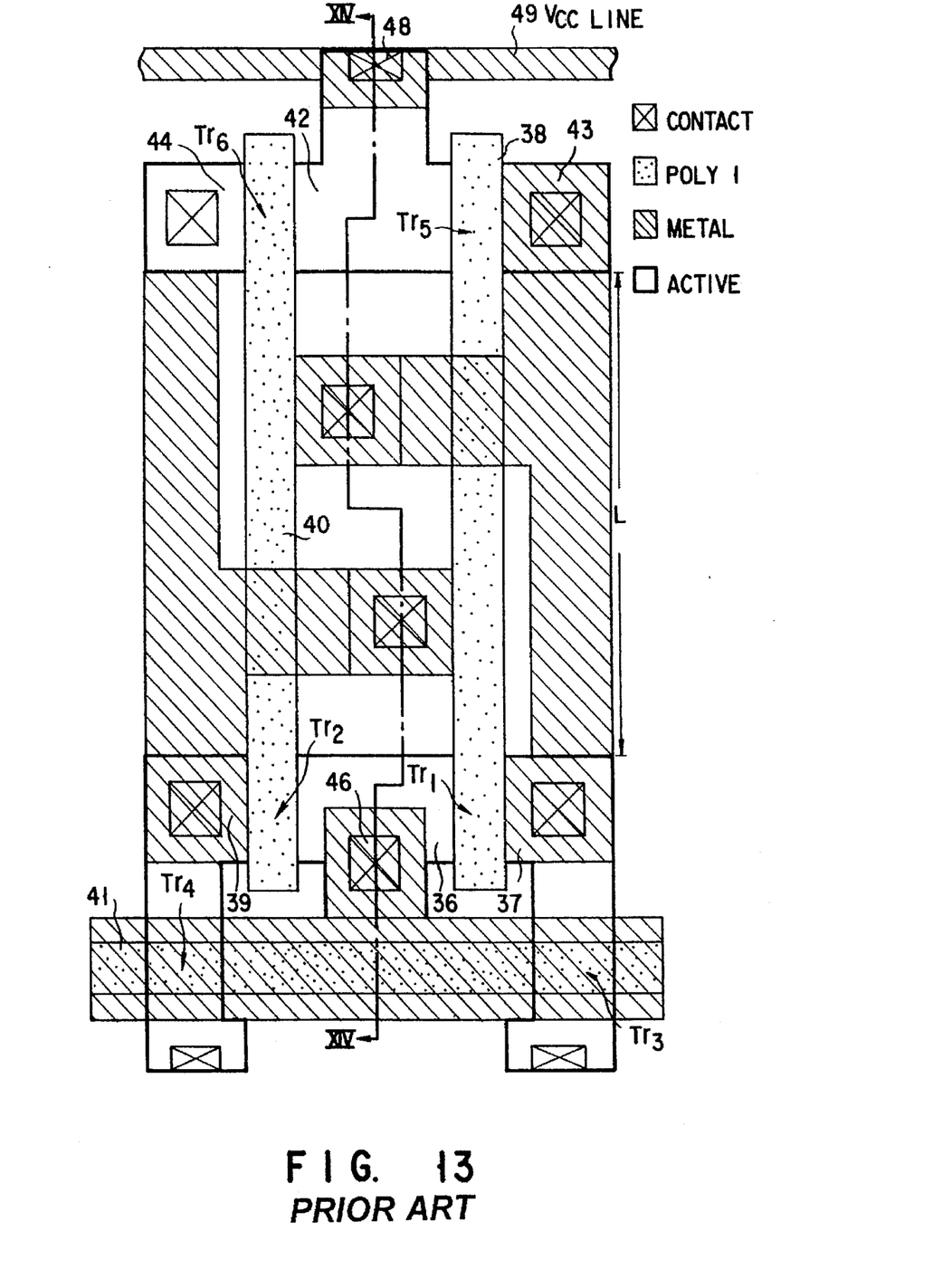
FIG. 13 is a plane view showing a conventional six transistor type SRAM.
Figure 14:
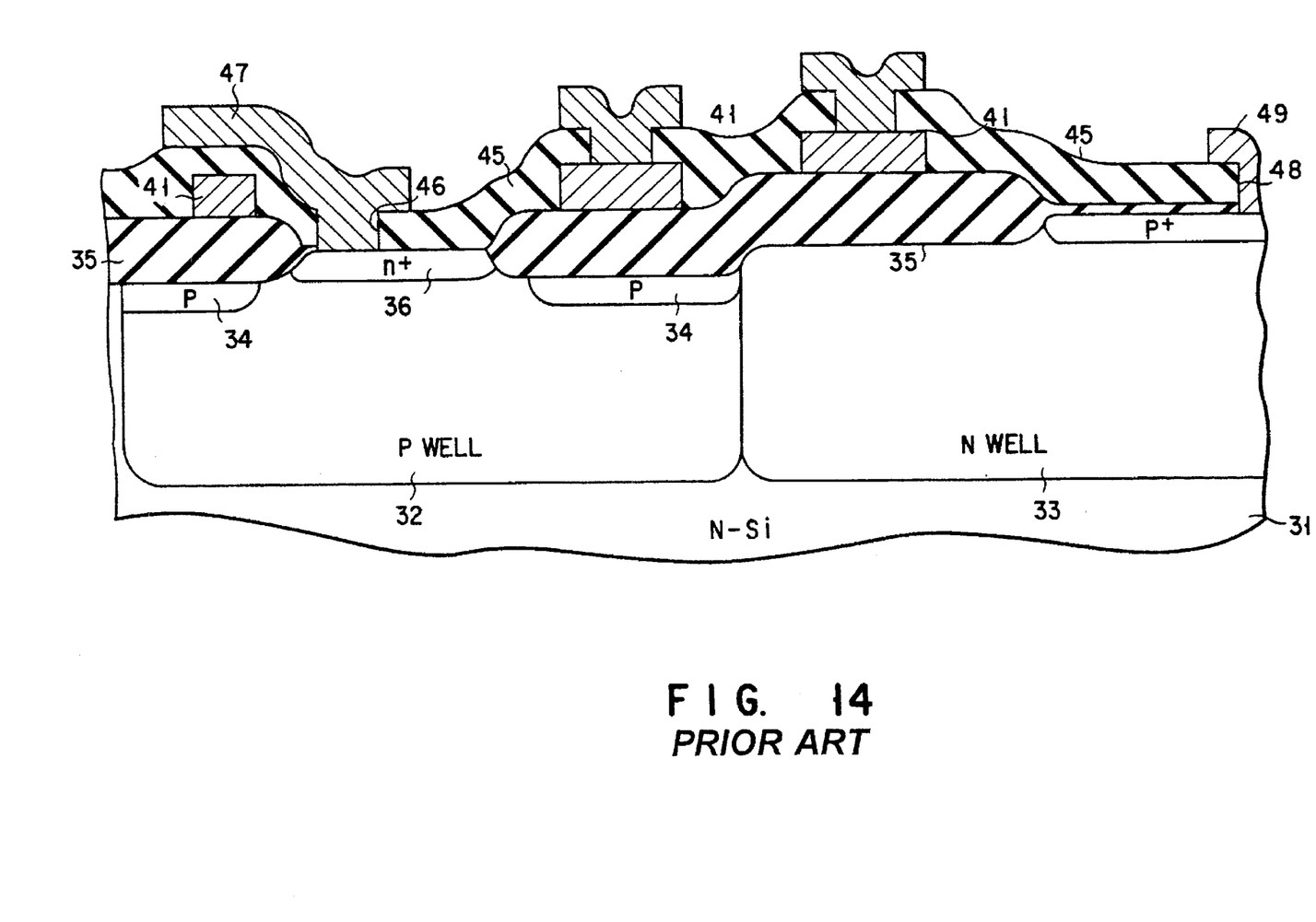
FIG. 14 is a cross sectional view along line XIV—XIV shown in FIG. 13.
Figure 15:
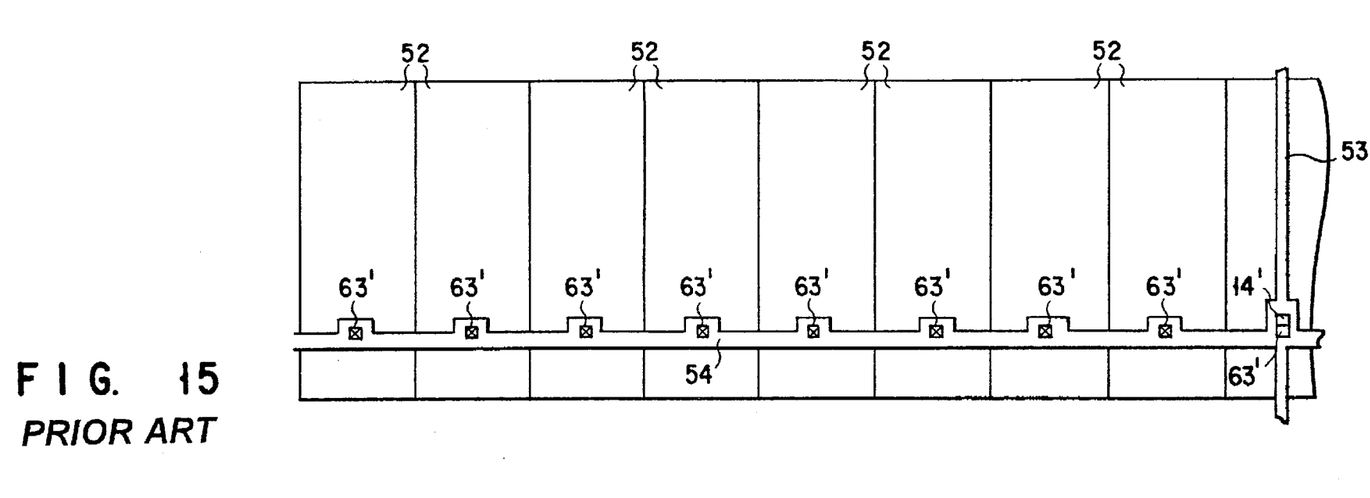
FIG. 15 schematically shows an array of cells each consisting of the SRAM shown in FIG. 13.

FIG. 13 is a plane view showing a conventional six transistor type SRAM cell, with FIG. 14 showing a cross section along line XIV—XIV shown in FIG. 13. Further, FIG. 15 schematically shows an array of SRAM cells shown in FIG. 13. As shown in these drawings, a P-well 32, an N-well 33, a P-channel stopper layer 34, a field oxide film 35, etc. are formed on the surface of an N-type Si substrate 31. An NMOS transistor Tr1 comprising an $n^+$-type source region 36, an $n^+$-type drain region 37 and a gate electrode 38 is formed in the P-well 32. Another NMOS transistor Tr2 consisting of the $n^+$-type source region 36, $n^+$-type drain region 39 and a gate electrode 40 is formed in the P-well 32. Similarly, formed is an NMOS transistor Tr3 comprising a source region (not numbered), a drain region 37, and a word line 41 acting as a gate. Also formed is an NMOS transistor Tr4 comprising a source region (not numbered), a drain region 39, and a word line 41 acting as a gate.

On the other hand, a PMOS transistor Tr5 comprising a $p^+$-type source region 42, a $p^+$-type drain region 43 and a gate electrode 37 is formed in the the N-well 33. Similarly, a PMOS transistor Tr6 comprising the $p^+$-type source region 42, a $p^+$-type drain region 44 and a gate electrode 40 is also formed within the element region inside the N-well 33. An interlayer dielectric film 45 is formed on the substrate 31 including the P-well 32 and the N-well 33. A contact hole 46 is formed through the interlayer dielectric film 45 to expose the $n^+$-type source region 36 in the P-well 32. The contact hole 46 is then filled with a conductive material for the connection between the source region 36 and a GND line 47. Another contact hole 48 is formed through the interlayer dielectric film 45 to expose the $p^+$-type source region 42 in the N-well 33. The contact hole 48 is then filled with a conductive material for the connection between the source region 42 and a Vcc line 49.

In the conventional six transistor type SRAM described above, a memory cell cross coupling wiring portion, the Vcc line 49, and the GND line 47 are formed using the same metal layer. In each memory cell, the GND line 47 is connected via the contact electrode 46 to only the $n^+$-type source region 36 in the P-well 32. Also, a P-well contact 14' serving to connect the P-well to the GND line is arranged outside the region where memory cell arrays are formed, as shown in FIG. 15. It is seen that FIG. 15 covers a case of 8-bit memory cell array. A GND line 53, which is common to the 8-bit memory cell array 52, is formed outside a region of 8-bit memory cell arrays. Also, the $n^+$-type source region 36 inside the P-well 32 is connected to the common GND line 53 via a GND lead line 54 which is directly connected to the $n^+$-type source region 36 for each memory cell. The P-well contact 14' and a GND contact 63' are formed adjacent to each other at the junction between the common GND line 53 and the lead line for each memory cell 52. It should be noted that the common GND line, GND lead line, and a local interconnector for each memory cell are formed of the same metal wire.

Where a P-well contact is formed in each memory cell in a 6-transistor type SRAM in an attempt to improve the latch-up resistance, it is difficult to make a layout such that the GND line does not go cross the memory cross coupling wiring. To avoid the difficulty, it is necessary to form a P-well contact outside a region where a memory transistor is formed. It is also necessary to place the PMOS and NMOS transistors within a memory cell apart from each other, resulting in a relatively large cell area.

Conventional techniques relevant to the present invention include, for example:

1. M. Helm, et al., 1993 Symp. on VLSI Tech. Digest of Technical Papers (1993), p. 65, "A LOW COST, MICROPROCESSOR COMPATIBLE, 18.4 µm², 6-T BULK CELL TECHNOLOGY FOR HIGH SPEED SRAMS", and 2. T. Izawa, et al., IEDM Tech. Dig., pp 34.8.1–34.8.3, 1994.

An object of the present invention is to provide a semiconductor memory device which can be operated with a high stability and with a smaller power consumption and which permits diminishing the cell area, compared with the conventional 6-transistor type SRAM.

DISCLOSURE OF THE INVENTION

According to the present invention, there is provided a semiconductor memory device comprising a 6-transistor type complete CMOS static memory cell composed such that a pass-gate NMOS transistor is connected to the intermediate node of a cross-coupled CMOS inverter circuit, wherein:

each memory cell has a P-well contact positioned adjacent to a GND contact and a Vcc contact, these contacts being commonly used for pull-down NMOS transistors and pull-up PMOS transistors, respectively, and placed between a pair of gates formed in parallel with a bit line; and the P-well contact consists of a $p^+$-type diffusion layer formed in the P-well in contact with an $n^+$-type source region of the pull-downMOS transistor, said $p^+$-type diffusion layer being positioned closer to the boundary between the P-well and the N-well than the source region.

Constructions (1) to (4) given below are employed in the present invention.

(1) The P-well contact is connected to a GND line consisting of a single metal layer via a second wiring layer made of a polysilicon doped with a n-type impurity. The GND line is formed in parallel with and interposed between two bit lines.

(2) The Vcc contact consists of an $n^+$-type diffusion layer located in contact with a source region of a PMOS transistor formed within the N-well. The Vcc contact is connected via a buried contact to a second polysilicon layer doped With an n-type impurity, said polysilicon layer forming a Vcc line. The Vcc line extends in a direction perpendicular to the bit line.

(3) The drain regions of the PMOS transistors and NMOS transistors, which are cross-coupled to form a CMOS inverter circuit, are connected to the gates of these transistors, said gates being formed of a first polysilicon layer, via the internal wiring of a second polysiticon layer doped with an n-type impurity, and these connecting portions are formed by self-alignment.

(4) A titanium silicide layer having a second polysilicon pattern (wiring) formed thereon is formed to cover the surface of a P-well contact, the surface of a Vcc contact, or the surface of a buried contact.

In the present invention, a P-well contact adjacent to the GND contact is formed between the source region of the PMOS transistor and the source region of the NMOS transistor. The particular construction permits improving the latch-up resistance so as to allow the PMOS and NMOS transistors to be placed relatively close to each other, with the result that the entire cell area can be diminished from the conventional level.

Construction (1) given above permits markedly improving the degree of symmetry of the cell arrangement.

Constructions (2) and (3) make it possible to employ a buried contact formed by self-alignment in forming six transistors, with the result that the cell area can be decreased.

Further, construction (4) given above is effective for preventing a PN junction from being formed at the interface between the second polysilicon layer and, for example, a diffusion layer on the well surface.

BEST MODE FOR WORKING THE INVENTION

Figure 1:
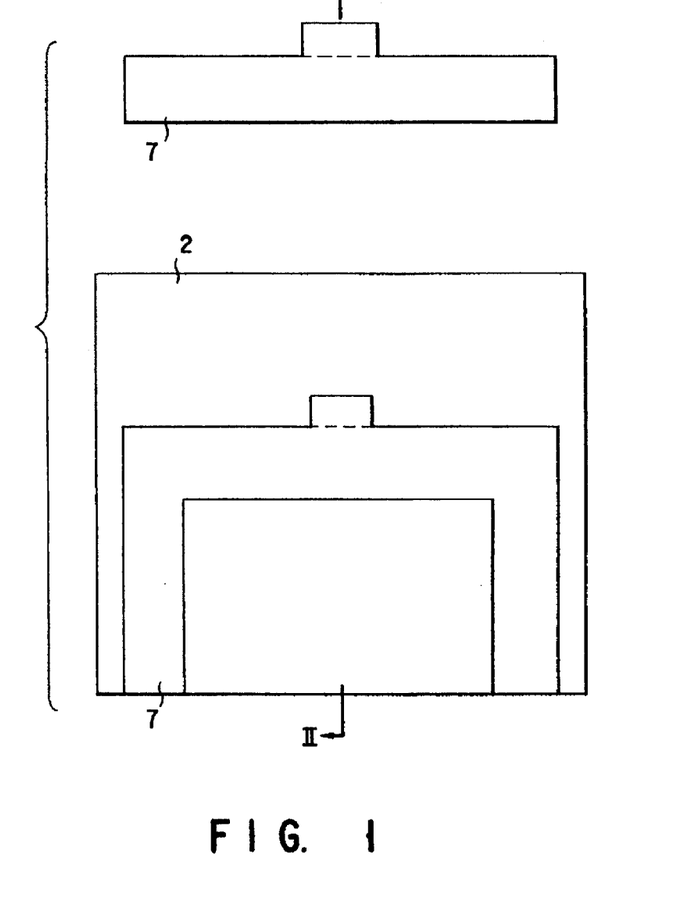
FIG. 1 is a plane view showing the steps required for making active regions in a Si substrate in manufacturing a semiconductor memory device according to one embodiment of the present invention.
Figure 2:
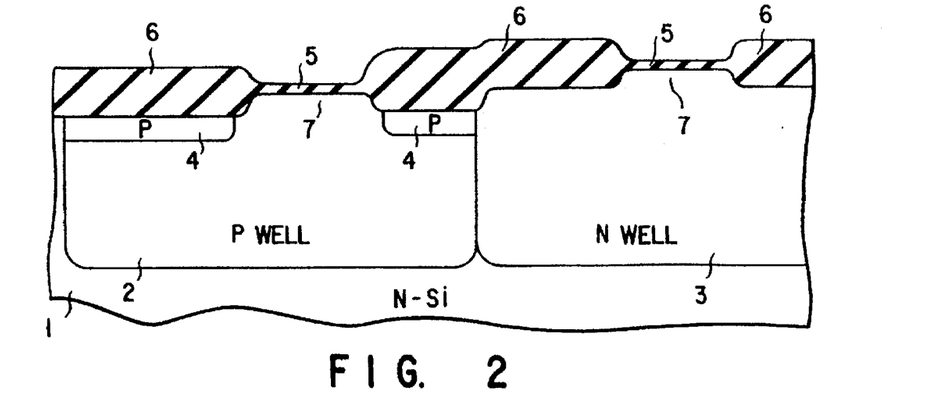
FIG. 2 is a cross sectional view along line II—II shown in FIG. 1.

FIGS. 1 to 8 collectively show how to manufacture a semiconductor memory device (SRAM) according to one embodiment of the present invention. As shown in FIGS. 1 and 2, a P-well 2, an N-well 3, and N-channel stop layers 4 were formed by the known technique on an N-type Si substrate 1, followed by forming a field oxide film 6 by using a silicon nitride pattern (not shown). Then, the silicon nitride pattern was removed, followed by forming a gate oxide film 5. A reference numeral 7 denotes an element region surrounded by the field oxide film 6. Incidentally, FIG. 2 is a cross sectional view along line II—II shown in FIG. 1.

Figure 3:
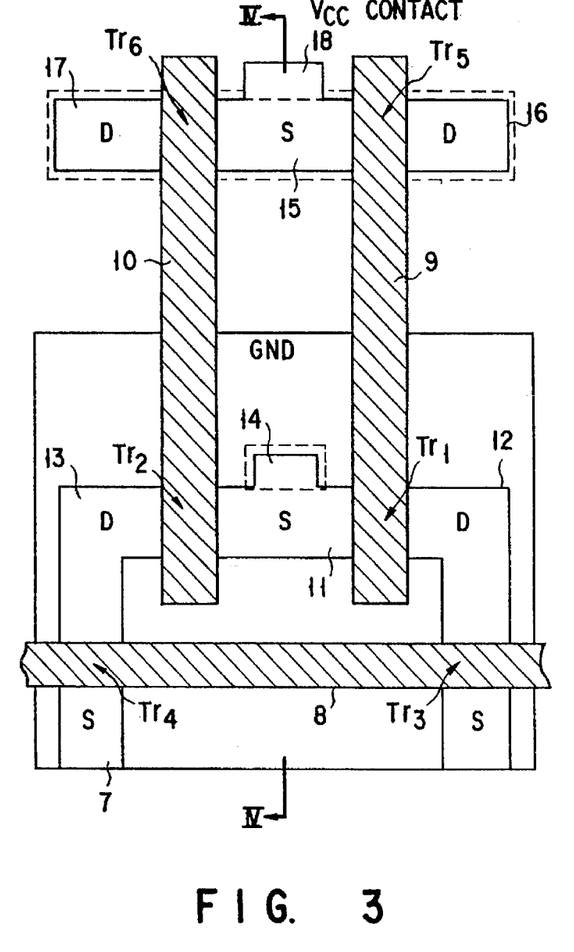
FIG. 3 is a plane view showing the steps required for forming gates, source and drain regions, a GND contact and a Vcc contact in manufacturing a semiconductor memory device according to one embodiment of the present invention.
Figure 4:
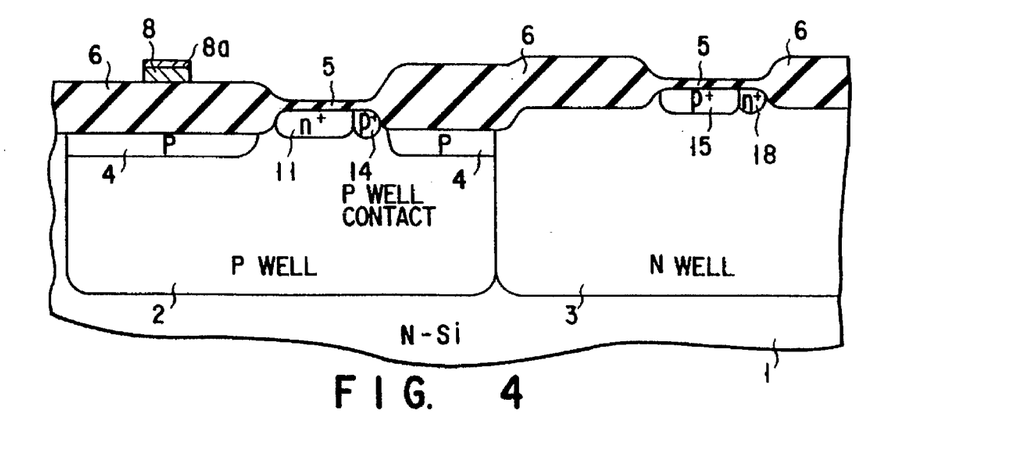
FIG. 4 is a cross sectional view along line IV—IV shown in FIG. 3.

In the next step, a laminate structure consisting of a first polysilicon layer, which was 300 nm thick, and a silicon nitride film 8a, which was 180 nm thick, was formed on the entire surface by CVD under a reduced pressure, followed by patterning the laminate structure to form a word line 8, as shown in FIGS. 3 and 4. Also formed were a gate 9 common for a pull-down NMOS transistor Tr1 and a pull-up PMOS transistor Tr5 and a gate 10 common for a pull-down NMOS transistor Tr2 and a pull-up PMOS transistor Tr6. Each of these gates 9 and 10 is formed of the first polysilicon layer and extends in a direction perpendicular to the word line 8.

Then, an n$^+$-type source region 11 and n$^+$-type drain regions 12 and 13 were formed within the element region 7 inside the P-well. Also formed was a p$^+$-type P-well contact (diffusion layer) 14 in contact with the source region 11. Similarly, a p$^+$-type source region 15 and p$^+$-type drain regions 16 and 17 were formed within the element region 7 inside the N-well. Also formed was an n$^+$-type Vcc contact (diffusion layer) 18 in contact with the source region 15. Incidentally, "S" and "D" shown in FIG. 3 denotes source and drain regions, respectively.

It should be noted that the transistor Tr1 comprises the source region 11, the drain region 12 and the gate 9. The transistor Tr2 comprises the source region 11, the drain region 13 and the gate 10. A pass-gate NMOS transistor Tr3 is formed of a source region (not numbered), the drain region 12 and the word line 8 acting as a gate. Similarly, a pass-gate NMOS transistor Tr4 is formed of a source region (not numbered), the drain region 13 and the word line 8 acting as a gate. The transistor Tr5 comprises the source region 15, the drain region 16 and the gate 9. Further, the transistor Tr6 comprises the source region 15, the drain region 17 and the gate 10. The regions surrounded by broken lines in FIG. 3 denote masks for forming the p$^+$-regions. The masks with black and white regions inverted are used for forming n$^+$-type regions.

Figure 5:
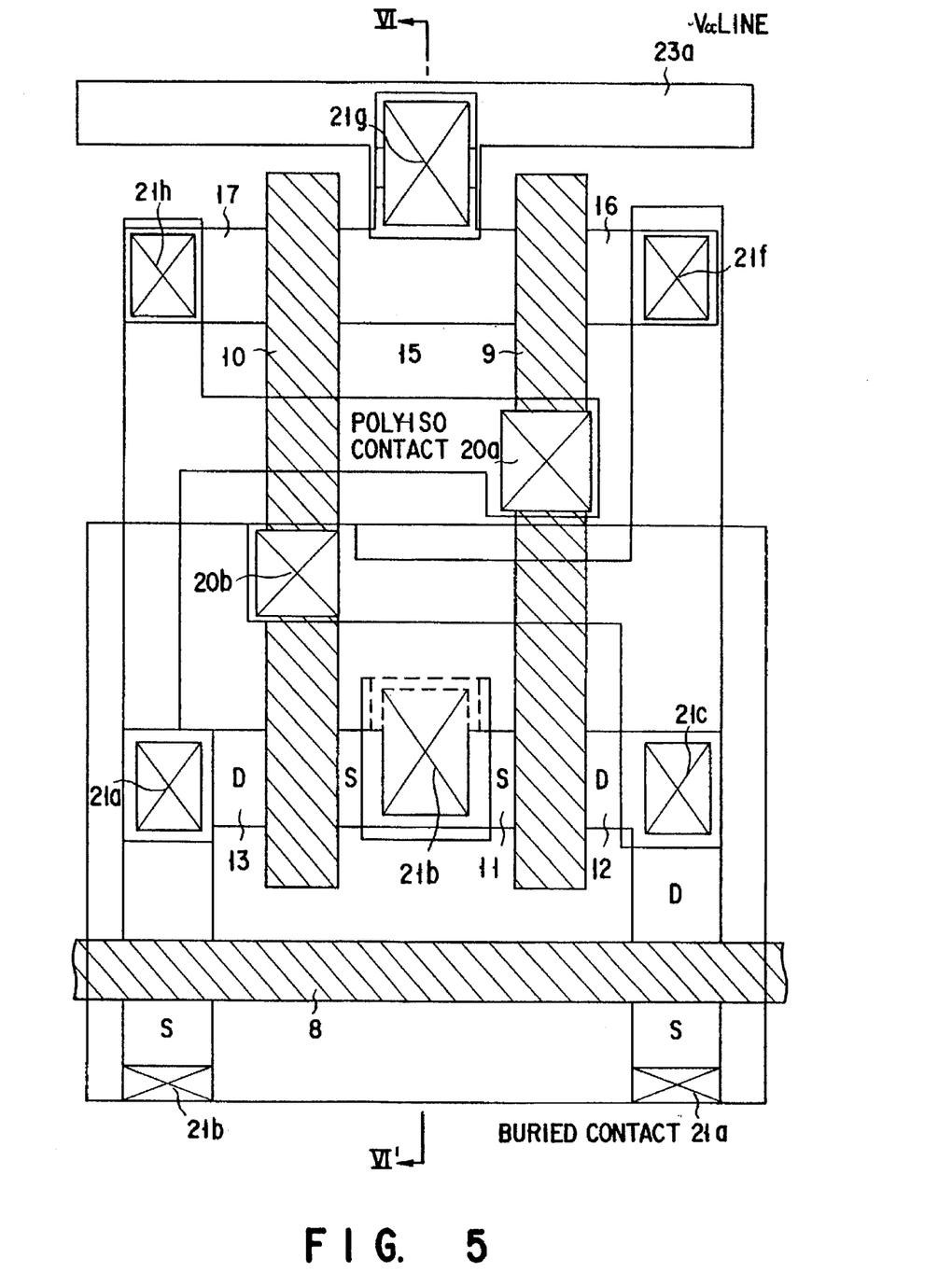
FIG. 5 is a plane view showing the steps required for forming a TiSi layer on a second polysilicon pattern for inverter cross coupling in manufacturing a semiconductor memory device according to one embodiment of the present invention.
Figure 6:
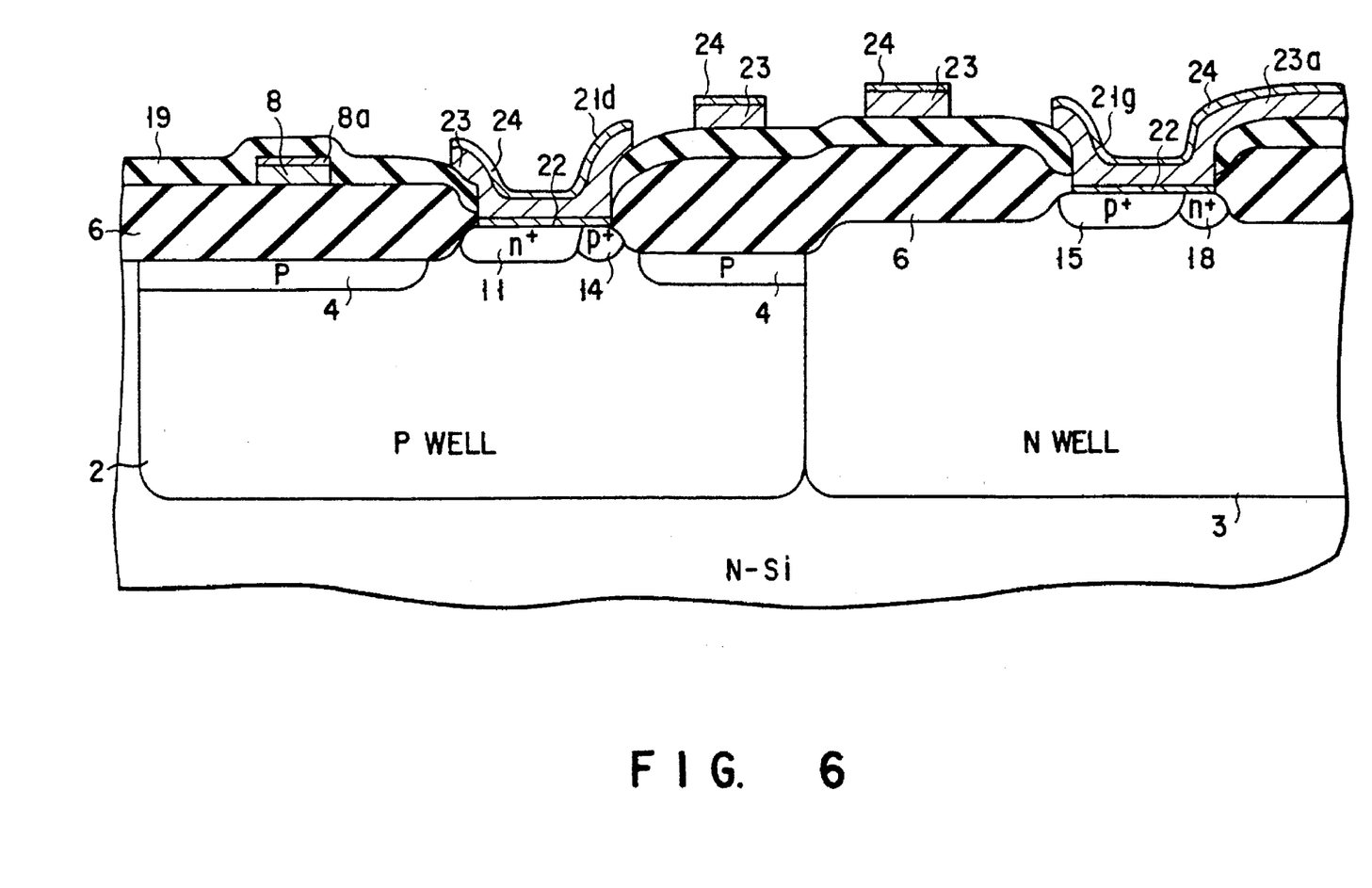
FIG. 6 is a cross sectional view along line VI—VI shown in FIG. 5.

In the next step, a first interlayer dielectric film (P-CVD film) 19 of about 150 nm thickness was formed on the entire surface, as shown in FIGS. 5 and 6. Then, the dielectric film 19 located on the gates 9 and 10 and the silicon nitride film 8a were selectively removed by etching to form poly-iso contacts (i.e., contact between the first polysilicon layer and the second polysilicon layer) 20a, 20b by self-alignment. Further, the interlayer insulating film 19 located above the element regions 7 was selectively removed by etching to form buried contacts 21a, 21b, 21c, 21d, 21e, 21f, 21g and 21h. After the etching steps, a Ti film was formed on the entire surface by, for example, sputtering. Then, a TiSi layer 22 was formed by two-stage RTP (rapid thermal process) (700°C./900°C.) on the surface portions exposed by the poly-iso contacts 20a, 20b and by the buried contacts 21a, 21b, 21c, 21d, 21e, 21f, 21g and 21h. It should be noted that, in the buried contact 21d, the TiSi layer 22 was formed to cover the surfaces of both the n$^+$-type source region 11 and the p$^+$-type P-well contact 14. Also, in the buried contact 21g, the TiSi layer 22 was formed to cover the surfaces of both the p$^+$-type source region 15 and an n$^+$-type Vcc contact 18.

Then, Ti which had not been converted into its silicide was removed, followed by forming a second polysilicon layer on the entire surface. Arsenic ions were implanted into the second polysilicon layer and activated by RTP (800°C.). Then, the polysilicon layer was patterned by a photoetching method to form a second polysilicon pattern 23, followed by forming a Ti layer on the entire surface by sputtering. Further, a TiSi layer 24 was formed on the surface of the polysilicon pattern 23 by RTP (640°C.), followed by removing Ti which had not been converted into its silicide. Incidentally, a reference numeral 23a shown in FIGS. 5 and 6 denotes a Vcc line formed of the second polysilicon layer.

Figure 7:
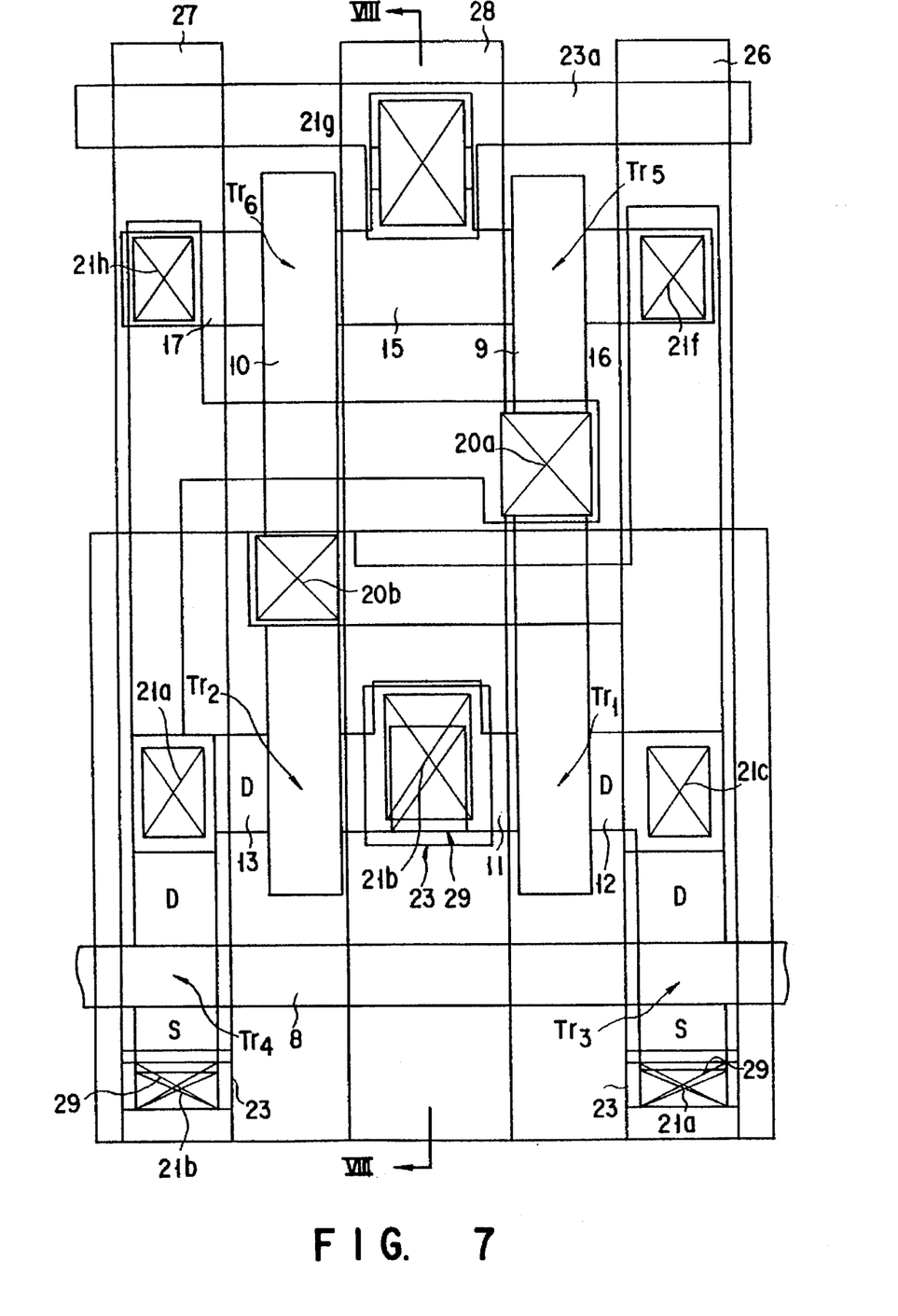
FIG. 7 is a plane view showing the final steps required for forming a bit line and a GND line, each consisting of a single metal layer, on a second interlayer dielectric film in manufacturing a semiconductor memory device according to one embodiment of the present invention.
Figure 8:
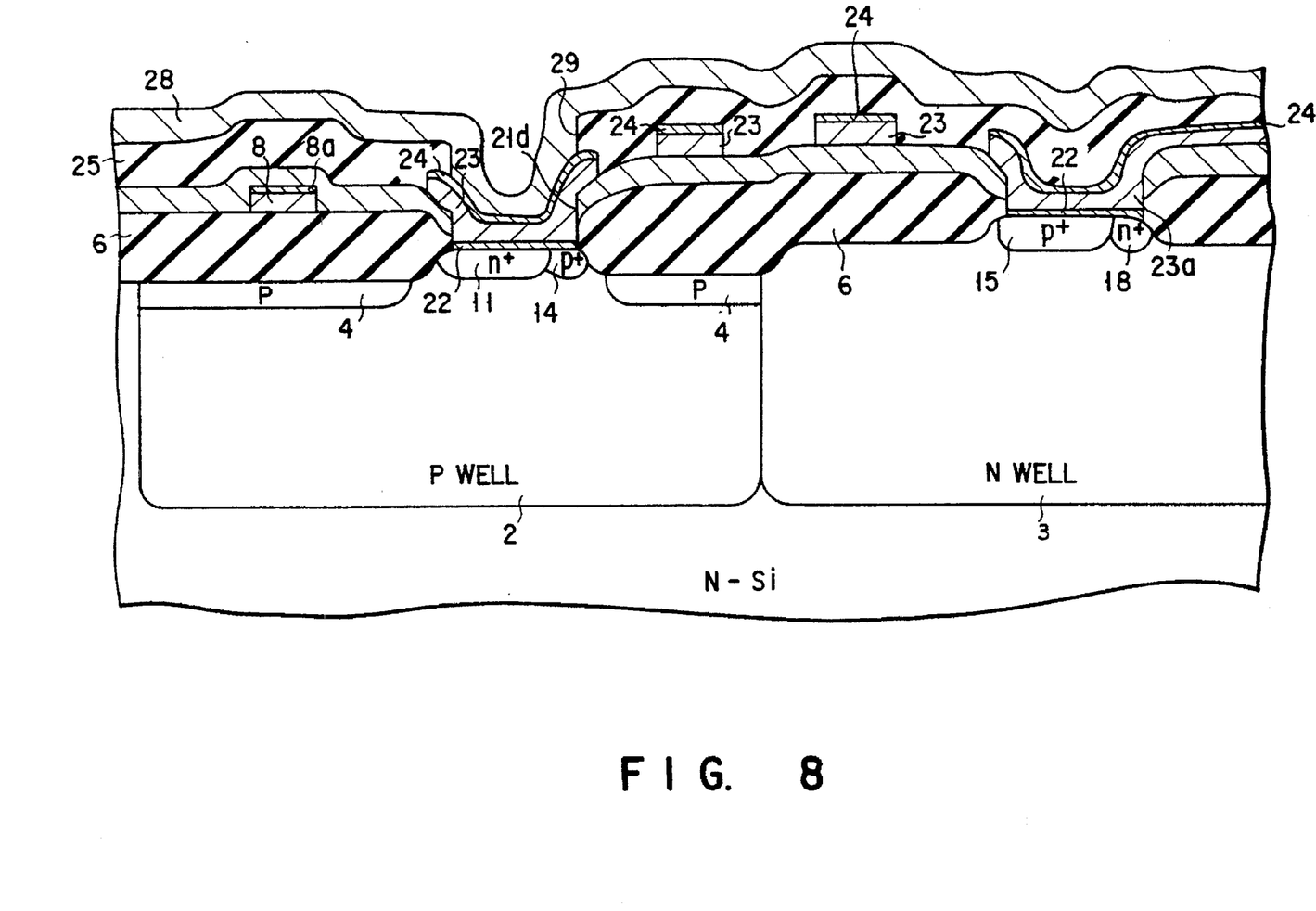
FIG. 8 is a cross sectional view along line VIII—VIII shown in FIG. 7.

In the next step, a second interlayer dielectric 25 film 25 was formed on the entire surface, as shown in FIGS. 7 and 8. Then, those portions of the second interlayer dielectric film 25 which were located above the buried contacts 21a, 21b and 21d were selectively removed to form contact holes 29, followed by forming an AlSiCu layer on the entire surface by sputtering. The AlSiCu layer was patterned to form a first bit line 26, a second bit line 27 and a GND line 28 which were brought into contact with the TiSi layer 24 in the buried contacts 21a, 21b and 21d, respectively.

Figure 12:
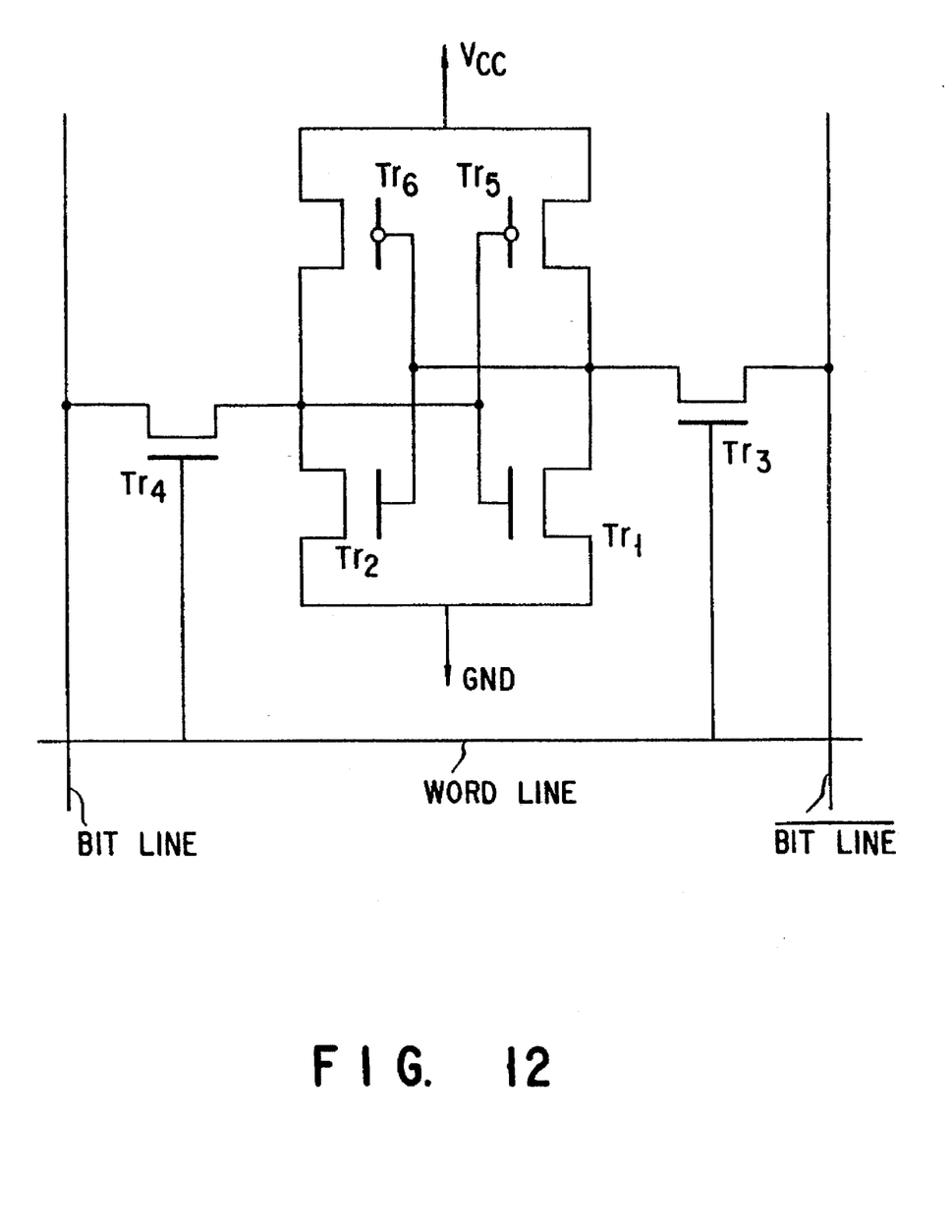
FIG. 12 is a circuit diagram of a semiconductor memory device according to one embodiment of the present invention.

FIG. 12 is a circuit diagram covering the semiconductor memory device shown in FIGS. 7 and 8. As apparent from the circuit diagram, the device shown in FIGS. 7 and 8 is an SRAM having a six transistor-type complete CMOS static cell which is composed such that pass-gate NMOS transistors are connected to an intermediate node of a cross-coupled CMOS inverter circuit.

The pull-down NMOS transistor Tr1 shown in FIG. 12 comprises the n$^+$-type source region 11, the n$^+$-type drain region 12, and the gate 9 made of the first polysilicon layer. The pull-down NMOS transistor Tr2 comprises the n$^+$-type source region 11, the n$^+$-type drain region 13, and the gate 10 made of the first polysilicon layer. The pass-gate NMOS transistor Tr3 comprises an n$^+$-type source region (not shown), the n$^+$-type drain region 12, and the gate (word line) 8 made of the first polysilicon layer. The pass-gate NMOS transistor Tr4 comprises an n$^+$-type source region (not shown), the n$^+$-type drain region 13, and the gate (word line) 8 made of the first polysilicon layer. The PMOS transistor Tr5 comprises the p$^+$-type source region 15, the p$^+$-type drain region 16, and the gate 9 made of the first polysilicon layer. Further, the PMOS transistor Tr6 comprises the p$^+$-type source region 15, the p$^+$-type drain region 17, and the gate 10 made of the first polysilicon layer.

In the semiconductor memory device manufactured as described above, the field oxide film 6 is formed on a predetermined surface region of the N-type Si substrate 1. A static memory cell is formed by utilizing PMOS and NMOS transistors formed within the element region surrounded by the field oxide film 6. It should be noted that each memory cell comprises a P-well contact 14 formed adjacent to a GND contact 63 and a Vcc contact 18. These contacts 14, 18 are positioned between the gate 9 for the transistors Tr1, Tr5 and the gate 10 for the transistors Tr2, Tr6, these gates 9 and 10 being formed in parallel with two bit lines 26, 27. The P-well contact 14 consists of a p$^+$-type diffusion layer formed within the P-well 2 in contact with the n$^+$-type source region 11 common for the pull-down NMOS transistors Tr1, Tr2. Further, the p$^+$-type diffusion layer is placed closer to the boundary between the P-well 2 and the N-well 3 than the source region 11.

Further, the P-well contact 14 is connected to the GND line 28 via the second polysilicon layer 23 doped with an n-type impurity. The GND line 28 is arranged between and in parallel with the two bit lines 26 and 27.

Figure 16:
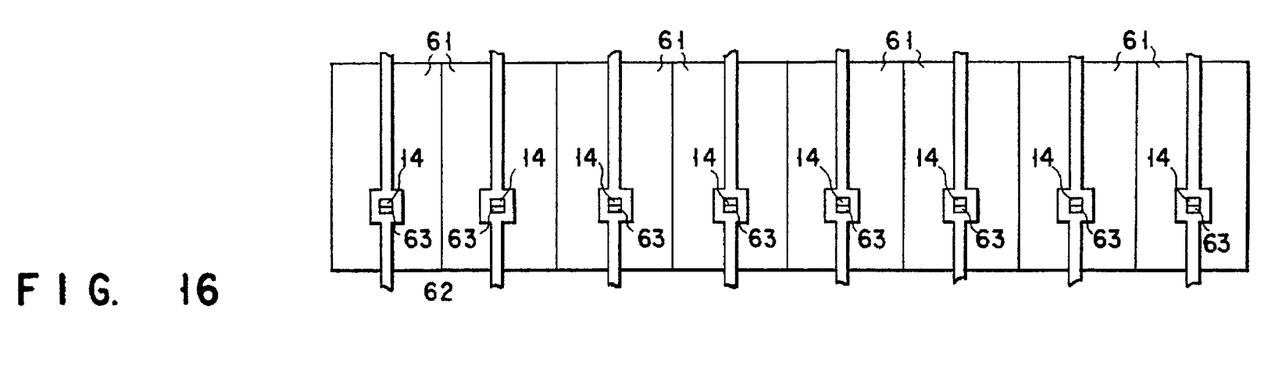
FIG. 16 schematically shows an array of cells each consisting of the SRAM shown in FIG. 7.

The semiconductor memory device of the construction described above produces prominent effects as follows:

(1) Since the second polysilicon layer is used for forming the local interconnect and the Vcc line 23a, it is possible to avoid wiring layout troubles between these parts of memory cell and the GND line 28 made of a metal. As a result, a GND line 62 can be formed for each memory cell 61, as shown in FIG. 16. Also, the P-well contact 14 is formed within the P-well 2 in contact with the source region 11 of the pull-down NMOS transistor Tr1, and is positioned closer to the boundary between the P-well 2 and the N-well 3. As a result, the latch-up resistance can be improved. In addition, the distance between the PMOS transistor and the NMOS transistor can be shortened, making it possible to realize such a smaller cell. As a matter of fact, the distance L between the PMOS transistor and the NMOS transistor was found to be 3.6 μm under a design rule of 0.5 μm in the embodiment of the present invention shown in FIGS. 7 and 8, in contrast to 5.4 μm for the conventional device shown in FIG. 13.

(2) The P-well contact 14 adjacent to the GND contact 63 is connected to the GND line 28 consisting of a single metal layer via the second polysilicon layer doped with an n-type impurity, said polysilicon layer being used as a wiring. Since the GND line 28 is arranged between and in parallel with the two bit lines 26, 27, the degree of symmetry of the cells can be markedly improved.

(3) The Vcc contact 18 is formed in contact with the source region 15 of the PMOS transistor formed in the N-well 3, and is connected to the second polysilicon layer doped with an n-type impurity through or within a buried contact, said polysilicon layer forming the Vcc line 23a which extends in a direction perpendicular to the bit lines 26, 27. Since the buried contact is used for forming a transistor, the cell area can be decreased.

(4) The drain regions of the PMOS transistors Tr5, Tr6 and the NMOS transistors Tr1, Tr2, said transistors Tr1, Tr2, Tr5, Tr6 forming a cross-coupled CMOS inverter circuit, are connected to the gates 9, 10 made of the first polysilicon layer via an internal wiring made of the second polysilicon layer doped with an n-type impurity. These connecting portions are formed by self-alignment. Since the self-aligned contacts are included in the transistors, the cell area can be diminished.

(5) The TiSi layer 22 having the second polysilicon pattern 23 (wiring) formed thereon is formed to cover the surfaces of both the n$^+$-type source region 11 and the p$^+$-type diffusion layer 14 in the P-well 2. Similarly, the TiSi layer 22 having the second polysilicon pattern 23a (Vcc line), formed thereon is formed to cover the surfaces of both the p$^+$-type source region 15 and the n$^+$-type diffusion layer 18 within the N-well 3. It follows that the TiSi layer 22 serves to prevent the doped polysilicon pattern 23 or 23a from forming a PN junction with the diffusion layer 14 or 18.

The present invention permits decreasing the cell area, compared with the conventional technique. Specifically, in the case of employing the technique of the present invention in a design rule of 0.5 μm, the cell area was diminished to about 58 μm$^2$ in contrast to 87 μm$^2$ for the conventional six transistor type cell. Also, where the P-well contact 14 is positioned closer to the boundary between the P-well 2 and the N-well 3 than the source region 11, as shown in FIGS. 7 and 8, it has been found possible to markedly improve the latch-up resistance, making it possible to diminish the p$^+$/n$^+$ distance from 5.4 μm to 3.6 μm in a design rule of 0.5 μm.

In the embodiment described above, the technical idea of the present invention is applied to an SRAM. However, the particular technical idea can also be applied to other devices, e.g., a cash memory embedded in MPU.

Also, in the embodiment described above, a TiSi layer was formed between the second polysilicon pattern and other layers such as a diffusion layer. However, a silicide of another metal having a high melting point can also be used in place of TiSi.

I claim:

1. A semiconductor memory device comprising a 6-transistor type complete CMOS static memory cell composed such that a gate-pass NMOS transistor is connected to the intermediate node of a cross-coupled CMOS inverter circuit, wherein:

each memory cell has a P-well contact positioned adjacent to a GND contact and a Vcc contact, said contacts being used for pull-down NMOS transistors and pull-up PMOS transistors, respectively, and placed between a pair of gates formed in parallel with a bit line; and the P-well contact consists of a p$^+$-type diffusion layer formed within the P-well in contact with an n$^+$-type source region of the pull-down MOS transistor, said P-well contact being placed closer to the boundary between the P-well and the N-well than the source region.

2. The semiconductor memory device according to claim 1, wherein said P-well contact is connected to a GND line consisting of a single metal layer via a second polysilicon layer doped with an n-type impurity, said polysilicon layer acting as a wiring, and said GND line is arranged between and in parallel with two bit lines.

3. The semiconductor memory device according to claim 1, wherein said Vcc contact consists of n$^+$-type diffusion layer in contact with the source region of the PMOS transistor formed in the N-well and is connected to a second polysilicon layer doped with an n-type impurity, said polysilicon layer forming the Vcc line, via a buried contact, said Vcc line extending in a direction perpendicular to the bit line.

4. The semiconductor memory device according to claim 1, wherein the drain regions of the PMOS and NMOS transistors forming the CMOS inverter circuit are connected to the gates of these transistors, said gates being formed of the first polysilicon layer, via the internal wiring of the second polysilicon layer doped with an n-type impurity, and these connecting portions are formed by self-alignment.

5. The semiconductor memory device according to claim 1, wherein a TiSi layer having a second polysilicon layer acting as a wiring formed thereon is formed to cover the surface of the P-well contact, the surface of the N-well contact, or the surface of a buried contact portion.

* * * * *